United States Patent
Todokoro

(10) Patent No.: US 10,551,615 B2
(45) Date of Patent: Feb. 4, 2020

(54) CASING OF OPTICAL SCANNING DEVICE

(71) Applicant: KYOCERA Document Solutions Inc., Osaka (JP)

(72) Inventor: Ryotaro Todokoro, Osaka (JP)

(73) Assignee: KYOCERA DOCUMENT SOLUTIONS INC, Osaka (JP)

( * ) Notice: Subject to any disclaimer, the term of this patent is extended or adjusted under 35 U.S.C. 154(b) by 0 days.

(21) Appl. No.: 16/301,175

(22) PCT Filed: Sep. 20, 2017

(86) PCT No.: PCT/JP2017/033886
§ 371 (c)(1),
(2) Date: Nov. 13, 2018

(87) PCT Pub. No.: WO2018/061929
PCT Pub. Date: Apr. 5, 2018

(65) Prior Publication Data
US 2019/0302446 A1  Oct. 3, 2019

(30) Foreign Application Priority Data
Sep. 29, 2016  (JP) .................................. 2016-192145

(51) Int. Cl.
*G03G 15/04* (2006.01)
*G02B 26/12* (2006.01)
(Continued)

(52) U.S. Cl.
CPC .......... *G02B 26/12* (2013.01); *G03G 15/043* (2013.01); *H04N 1/113* (2013.01); *H05K 5/03* (2013.01)

(58) Field of Classification Search
CPC ...... G02B 26/12; G03G 15/043; H04N 1/113; H05K 5/03
See application file for complete search history.

(56) References Cited

U.S. PATENT DOCUMENTS

2001/0009621 A1 * 7/2001 Nakazato ........... G03G 21/1839
399/111
2003/0081963 A1 * 5/2003 Mogi ....................... B41J 2/471
399/118
(Continued)

FOREIGN PATENT DOCUMENTS

JP  10-010452  1/1998
JP  2016-007745  1/2016

OTHER PUBLICATIONS

International Search Report dated Dec. 12, 2017 in International (PCT) Application No. PCT/JP2017/033886.

*Primary Examiner* — Hoang X Ngo
(74) *Attorney, Agent, or Firm* — Wenderoth, Lind & Ponack, L.L.P.

(57) ABSTRACT

An optical scanning device includes a casing (31). The casing (31) can be stacked in a plurality of stages in a state in which a lid member (32) has been removed, and includes a connection leg part (31e) extending from a predetermined position of the outside surface of a sidewall part (31b) to a lower side of a lower surface of the casing (31), and the connection leg part (31e) is provided with an engaged part (31g) for connection which is engaged with an engaging part (31d) formed at a sidewall part (31b) of another casing (31) when the casing (31) is stacked on an upper side of the other casing (31).

4 Claims, 9 Drawing Sheets

(51) Int. Cl.
*G03G 15/043* (2006.01)
*H04N 1/113* (2006.01)
*H05K 5/03* (2006.01)

(56) References Cited

U.S. PATENT DOCUMENTS

2007/0019265 A1 1/2007 Park et al.
2014/0375742 A1 12/2014 Otoguro et al.

* cited by examiner

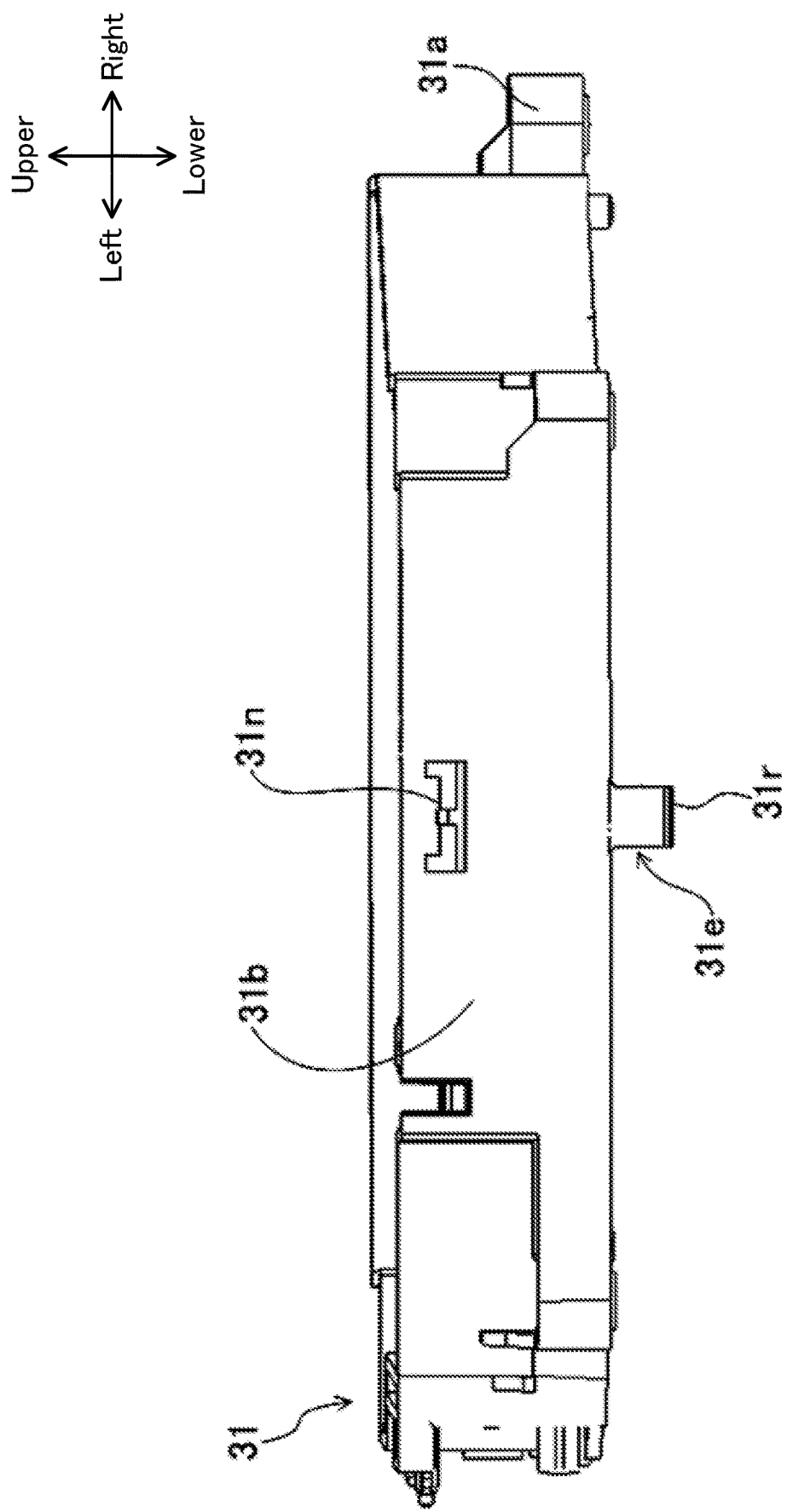

CASING OF OPTICAL SCANNING DEVICE

TECHNICAL FIELD

The present invention relates to a casing of an optical scanning device.

BACKGROUND ART

An electrophotographic image forming apparatus such as a copy machine and a printer includes an optical scanning device that emits light for forming an electrostatic latent image on a photoreceptor (for example, see Patent Literature 1). The optical scanning device has a bottomed box-like casing opened upward and an upper lid that closes an upper side of the casing. The casing is provided therein with an optical deflector that deflects and scans light beams emitted from a light source, and optical elements (an image forming lens, a return mirror and the like) that lead the light beams deflected and scanned by the optical deflector to a surface to be scanned. The upper lid is formed with an opening for leading the light beams having passed through the optical elements to an outer side of a housing body.

The casing has a bottom wall part and a sidewall part vertically upright from a peripheral edge part of the bottom wall part. The sidewall part is formed on the outside surface thereof with engaging protruding parts that protrude outside of the casing. The upper lid has a rectangular plate like-body plate part and convex parts that protrude downward from parts of each side of the body plate part, which correspond to the engaging protruding parts. The convex part is formed with a rectangular engaging hole. The engaging holes are engaged with the engaging protruding parts of the housing body, so that the upper lid is fixed to the casing.

CITATION LIST

Patent Literature

Patent Literature 1: Japanese Unexamined Patent Application Publication No. 2016-007745

SUMMARY OF INVENTION

Technical Problem

In the conventional optical scanner disclosed in the Patent document 1, it is necessary to form an optical element installation surface inside a casing with high precision in order to sufficiently ensure optical performance. Therefore, there is a case where casings are produced in a factory with superior forming capacity located in a place separately from a factory in which an optical scanner is assembled. In such a case, it is necessary to transport casings from the factory in which the casings are produced, to the factory in which the optical scanner is assembled. When the casings are transported, it is necessary to pack the casings one by one in order to prevent the occurrence of a scratch and the like due to contact of an object with the optical element installation surface of each casing, and to ensure spaces among the casings in order to prevent the casings from colliding with one another during the transportation. Therefore, when the number of casings entering into one packing box is limited, there is a problem that transportation cost increases.

The present invention has been made to solve the aforementioned problems, and an object of the present invention is to efficiently transport a casing in terms of space while protecting the interior of the casing.

Solution to Problem

A casing of an optical scanning device according to the present invention is a casing having a bottomed box shape and including a bottom wall part and a sidewall part upright from a peripheral edge part of the bottom wall part, wherein the sidewall part is formed on the outside surface thereof with an engaging part for engaging and fixing a lid member.

The casing can be stacked in a plurality of stages in a state in which the lid member has been removed, and includes a connection leg part extending from a predetermined position of the outside surface of the sidewall part to a lower side of a lower surface of the casing, and the connection leg part is provided with an engaged part for connection which is engaged with an engaging part formed at a sidewall part of another casing when the casing is stacked on an upper side of the other casing.

Advantageous Effects of Invention

According to the present invention, it is possible to efficiently transport a casing in terms of space while protecting the interior of the casing.

BRIEF DESCRIPTION OF DRAWINGS

FIG. 9 is a view corresponding to FIG. 3, which illustrates another embodiment.

DESCRIPTION OF EMBODIMENTS

Hereinafter, embodiments of the present invention will be described in detail on the basis of the drawings. It is noted that the present invention is not limited to the following embodiments.

Embodiment 1

Figure 1:
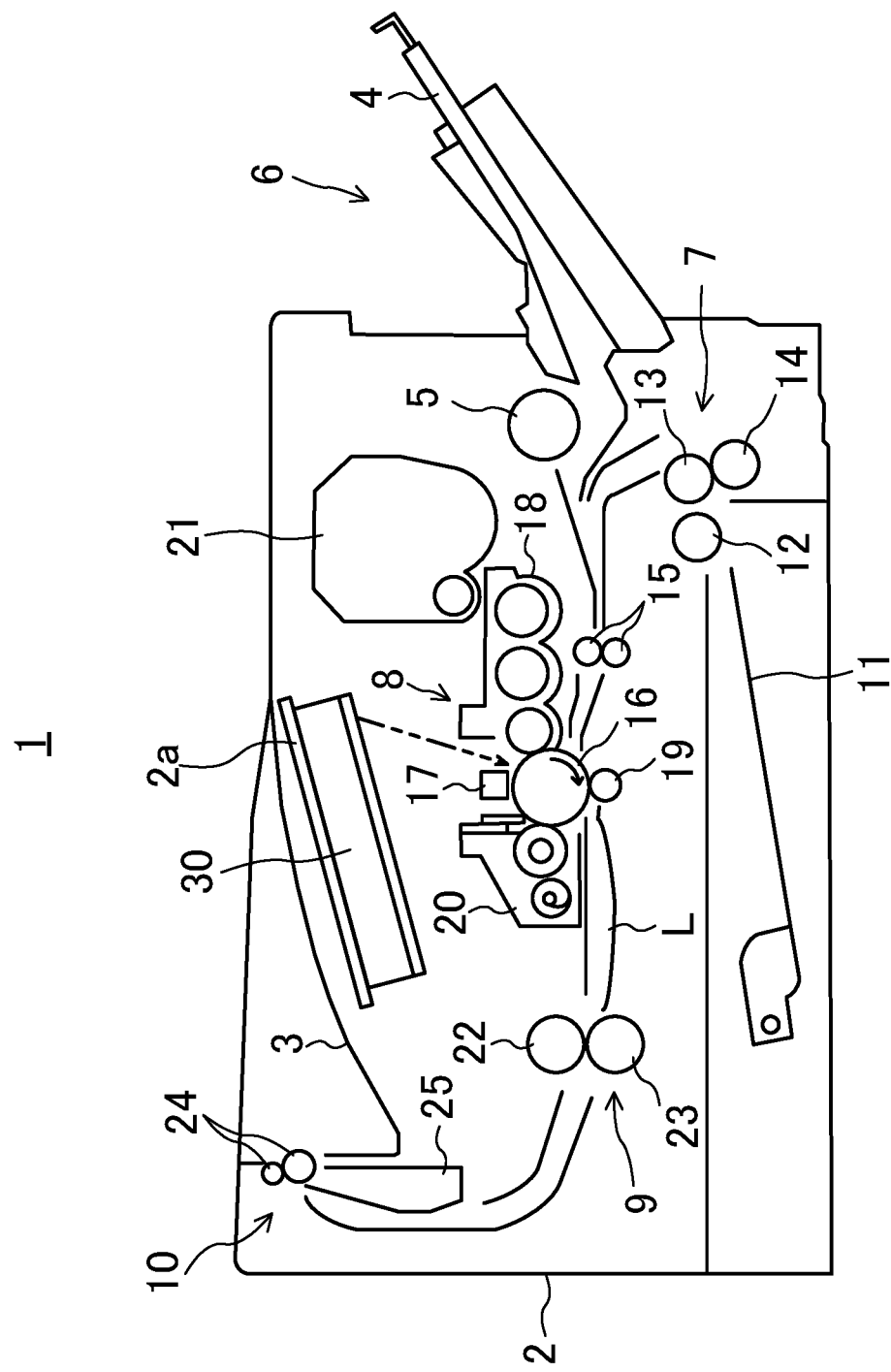
FIG. 1 is a schematic view illustrating an overall configuration of an image forming apparatus provided with a casing of an optical scanning device according to an embodiment.

FIG. 1 is a sectional view illustrating a schematic configuration of a laser printer 1 as an image forming apparatus in the present embodiment.

As illustrated in FIG. 1, the laser printer 1 includes a box-like printer body 2 (an image forming apparatus body), a manual sheet feeding unit 6, a cassette sheet feeding unit 7, an image forming unit 8, a fixing unit 9, and a sheet discharge unit 10. Accordingly, the laser printer 1 is configured to form an image on a sheet on the basis of image data transmitted from a terminal and the like (not illustrated) while conveying the sheet along a conveyance path L in the printer body 2.

The manual sheet feeding unit 6 has a manual tray 4 provided at one side of the printer body 2 so as to be openable and closable, and a manual sheet feeding roller 5 rotatably provided inside the printer body 2.

The cassette sheet feeding unit 7 is provided at a bottom part of the printer body 2. The cassette sheet feeding unit 7 includes a sheet feeding cassette 11 that stores a plurality of stacked sheets, a picking roller 12 that takes out the sheets in the sheet feeding cassette 11 one by one, and a feed roller 13 and a retard roller 14 that separate the taken-out sheets one by one and send the separated sheet to the conveyance path L.

The image forming unit 8 is provided above the cassette sheet feeding unit 7 in the printer body 2. The image forming unit 8 includes a photosensitive drum 16 (an image carrying member) rotatably provided in the printer body 2, a charging device 17, a developing unit 18, a transfer roller 19, a cleaning unit 20, which are disposed around the photosensitive drum 16, and an optical scanning device 30 and a toner hopper 21 disposed above the photosensitive drum 16. Accordingly, the image forming unit 8 is configured to form an image on a sheet supplied from the manual sheet feeding unit 6 or the cassette sheet feeding unit 7.

The conveyance path L is provided with a pair of resist rollers 15 that allow sent sheets to be temporarily waiting and then supply the sheets to the image forming unit 8 at a predetermined timing.

The fixing unit 9 is disposed at a lateral side of the image forming unit 8. The fixing unit 9 includes a fixing roller 22 and a pressure roller 23 brought into press-contact with each other and rotating together with each other. Accordingly, the fixing unit 9 is configured to fix a toner image, which has been transferred to a sheet in the image forming unit 8, to the sheet.

The sheet discharge unit 10 is provided above the fixing unit 9. The sheet discharge unit 10 includes a sheet discharge tray 3, a sheet discharge roller pair 24 for conveying a sheet to the sheet discharge tray 3, and a plurality of conveyance guide ribs 25 for guiding the sheet to the sheet discharge roller pair 24. The sheet discharge tray 3 is formed in a concave shape at an upper part of the printer body 2.

When the laser printer 1 receives image data, the photosensitive drum 16 is rotationally driven and the charging device 17 charges the surface of the photosensitive drum 16 in the image forming unit 8.

Then, on the basis of the image data, light beams are emitted to the photosensitive drum 16 from the optical scanning device 30. The laser beams are irradiated onto the surface of the photosensitive drum 16, so that an electrostatic latent image is formed. The electrostatic latent image formed on the photosensitive drum 16 is developed in the developing unit 18, so that the electrostatic latent image becomes a visible image as a toner image.

Thereafter, when the sheet passes through between the pressure roller 19 and the photosensitive drum 16, a transfer bias is applied to the toner image. By so doing, the toner image of the photosensitive drum 16 is moved and transferred to the sheet. The sheet with the transferred toner image is heated and pressed by the fixing roller 22 and the pressure roller 23 in the fixing unit 9. As a consequence, the toner image is fixed to the sheet.

<Optical Scanning Device>

Figure 2:
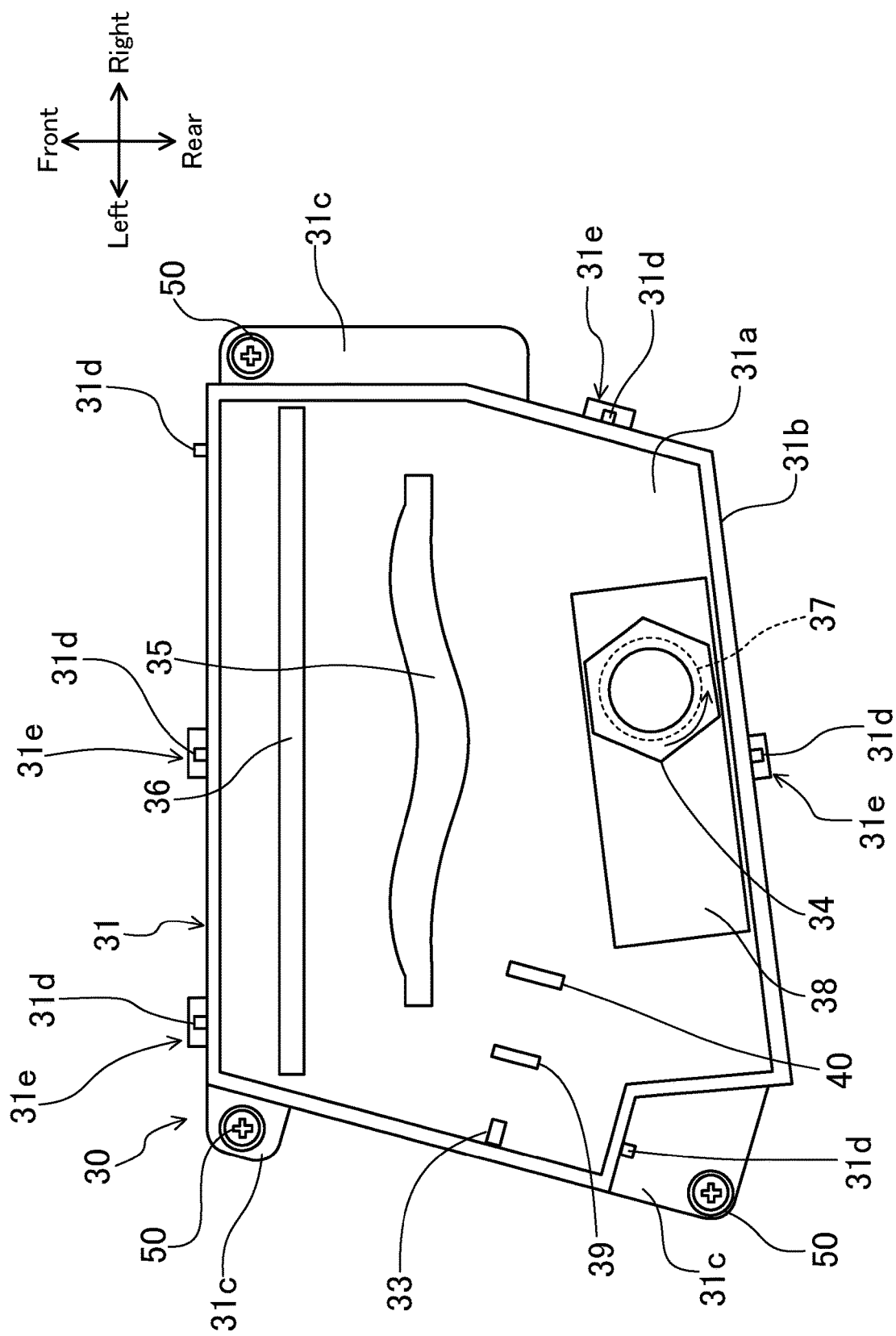
FIG. 2 is a plan view illustrating a state in which a lid member of an optical scanning device has been removed.

FIG. 2 is a plan view illustrating a schematic configuration of the optical scanning device 30 in the present embodiment. In the following description, an up and down direction of FIG. 2 is defined as a front and rear direction of the optical scanning device 30, and a right and left direction of FIG. 2 is defined as a right and left direction of the optical scanning device 30.

The optical scanning device 30 includes a bottomed box-like casing 31 opened upward, a lid member 32 (illustrated only in FIG. 5) that closes an upper side of the casing 31, a polygon mirror 34 provided inside the casing 31 and reflecting light from a light source 33, and an image forming lens 35 and a return mirror 36 provided on an optical path of the light reflected by the polygon mirror 34.

The polygon mirror 34 is fixed to a shaft of a polygon motor 37. The polygon mirror 34 is a rotating polygon mirror and is rotationally driven by the polygon motor 37. The polygon motor 37 is fixed to a bottom wall part 31a of the casing 31 via a board 38 on which a control IC has been mounted.

The light source 33 is disposed near a sidewall part of the casing 31. The light source 33, for example, is a laser light source having a laser diode. Furthermore, the light source 33 is configured to emit laser beams toward the polygon mirror. Between the light source 33 and the polygon mirror 34, a collimator lens 39 and a cylindrical lens 40 are disposed.

The image forming lens 35 is installed at the bottom wall part 31a of the casing 31 on a lateral side (a front side) of the polygon mirror 34. The return mirror 36 is disposed at an opposite side (a front side) of the polygon mirror 34 side with respect to the image forming lens 35. The return mirror 36 extends in an elongated shape along the image forming lens 35.

The light beams emitted from the light source 33 are converted into parallel light beams by the collimator lens 39, and then are collected on the polygon mirror 34 by the cylindrical lens 40. The light collected on the polygon mirror 34 is reflected by a reflecting surface of the polygon mirror 34 and is incident on the image forming lens 35 as scanning light. The scanning light having passed through the image forming lens 35 is reflected by the return mirror 36 and is emitted toward the photosensitive drum 16 outside the casing 31 via an opening (not illustrated) formed in the lid member 32. By so doing, an image of the scanning light is formed on the surface of the photosensitive drum 16.

The scanning light having the image formed on the surface of the photosensitive drum 16 scans the surface of the photosensitive drum 16 in a main scanning direction due to the rotation of the polygon mirror 34 while scanning the surface of the photosensitive drum 16 in a sub-scanning direction due to the rotation of the photosensitive drum 16, so that an electrostatic latent image is formed on the surface of the photosensitive drum 16.

—Configuration of Casing of Optical Scanning Device—

Next, with reference to FIG. 2 to FIG. 5, the configuration of the casing 31 of the optical scanning device 30 according to the present embodiment will be described in detail. The casing 31 has the bottom wall part 31a, a sidewall part 31b upright from a peripheral edge part of the bottom wall part 31a, and three fixing seat parts 31c. The casing 31 is fixed to a fixing member 2a (see FIG. 1) of the printer body 2 by bolts passing through the fixing seat parts 31c. The casing 31 and the lid member 32 are all configured by a resin member.

Figure 3:
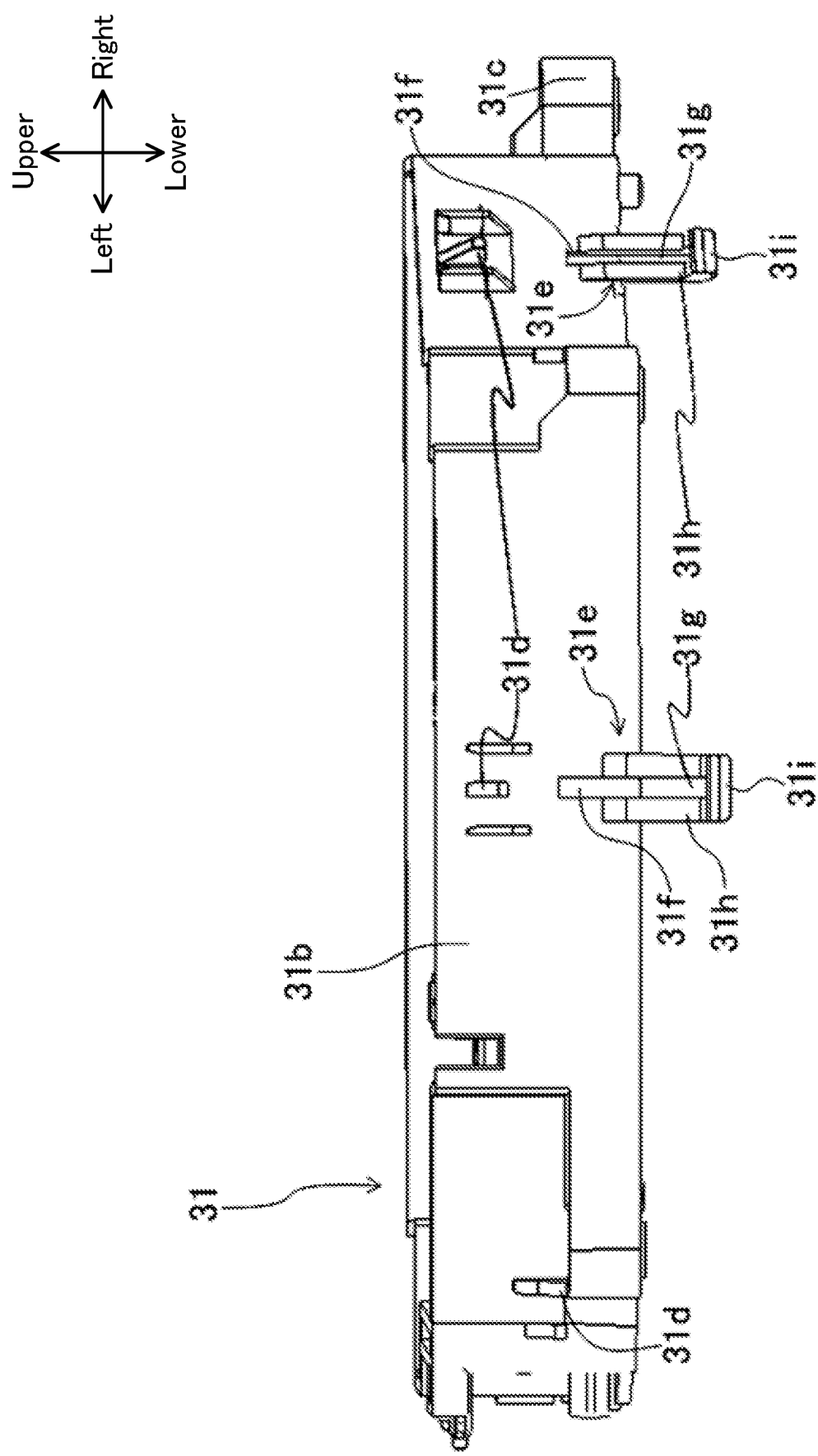
FIG. 3 is a side view illustrating a casing of an optical scanning device.

As illustrated in FIG. 2 and FIG. 3, engaging protruding parts 31d are formed at upper end part of the sidewall part 31b of the casing 31 to protrude outward. The engaging protruding parts 31d are used when the lid member 32 (see FIG. 5) is fixed to the casing 31 and when the casings 31 are connected to one another at the time of transportation of the casings 31.

In the present embodiment, six engaging protruding parts 31d are provided, and among them, three engaging protruding parts 31d are formed at the front side part of the sidewall part 31b of the casing 31 at approximately regular intervals in the right and left direction. The remaining three engaging protruding parts 31d are formed at the rear side part of the sidewall part 31b at approximately regular intervals in the right and left direction. Each of the engaging protruding parts 31d has a trapezoidal shape in which an upper edge is inclined downward toward the outside when viewed from the thickness direction.

The casing 31 is formed at the lower end part of the sidewall part 31b thereof with connection leg parts 31e. The connection leg parts 31e have a function of connecting a plurality casings 31 stacked in the up and down direction to one another as will be described later. In the present embodiment, four connection leg parts 31e are provided, and among them, two connection leg parts 31e are formed at positions corresponding to the center engaging protruding part 31d and the left engaging protruding part 31d at the front side part of the sidewall part 31b, and the remaining two connection leg parts 31e are formed at positions corresponding to the center engaging protruding part 31d and the right engaging protruding part 31d at the rear side part of the sidewall part 31b.

Each of the connection leg parts 31e has a rib part 31f, a plate-like part 31h, an engaged hole 31g, and a claw part 31i. The rib part 31f has a rectangular pillar shape extending in the up and down direction. The plate-like part 31h extends from the lower end part of the sidewall part 31b to the lower side of a lower surface of the casing 31. The engaged hole 31g is formed in a slit shape extending to a lower end part of the plate-like part 31h in the up and down direction. The claw part 31i protrudes outward from the lower end part of the plate-like part 31h. The claw part 31i is formed over the entire width direction of the plate-like part 31h. The claw part 31i has a trapezoidal shape in which a lower edge is inclined upward toward the outside when viewed from the width direction.

Figure 4:
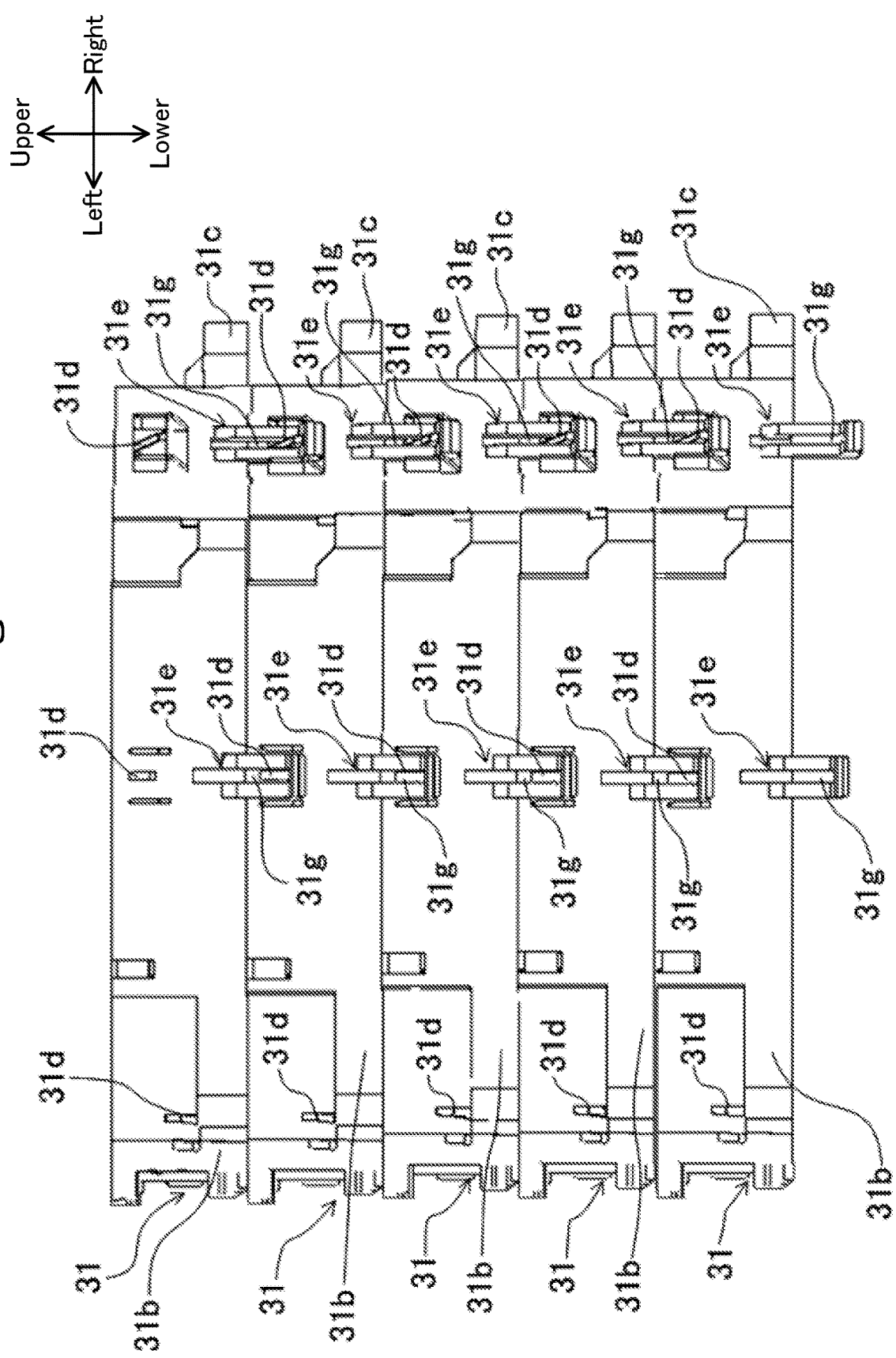
FIG. 4 is a side view illustrating a state in which a plurality of casings are stacked in an up and down direction and connected to one another.

As illustrated in FIG. 4, the casing 31 has an upper body from which the lid member 32 has been removed, and is conveyed in a state of being stacked in a plurality of stages (five stages in the example of FIG. 4) in the up and down direction as illustrated in FIG. 4. The plurality of casings 31 are connected to one another via the connection leg parts 31e. When the casings 31 are connected to one another, one casing 31 is stacked on an upper side of another casing, and the engaged hole 31g formed in the connection leg parts 31e of the one casing 31 is engaged with the engaging protruding parts 31d formed at the sidewall part 31b of the other casing 31.

By so doing, the casings 31 are stacked in a predetermined number of stages and connected to one another, and then all the connected casings 31 are packed with a predetermined packing material and are transported to a destination (for example, a factory). After the casings 31 reach the destination, the connected casings 31 are disassembled into individual casings, optical elements such as the polygon mirror 34, the image forming lens 35, and the return mirror 36 are assembled to each casing 31. Then, the lid member 32 is mounted at and fixed to an upper side of each casing 31, so that the optical scanning device 30 (see FIG. 5) is completed.

Figure 5:
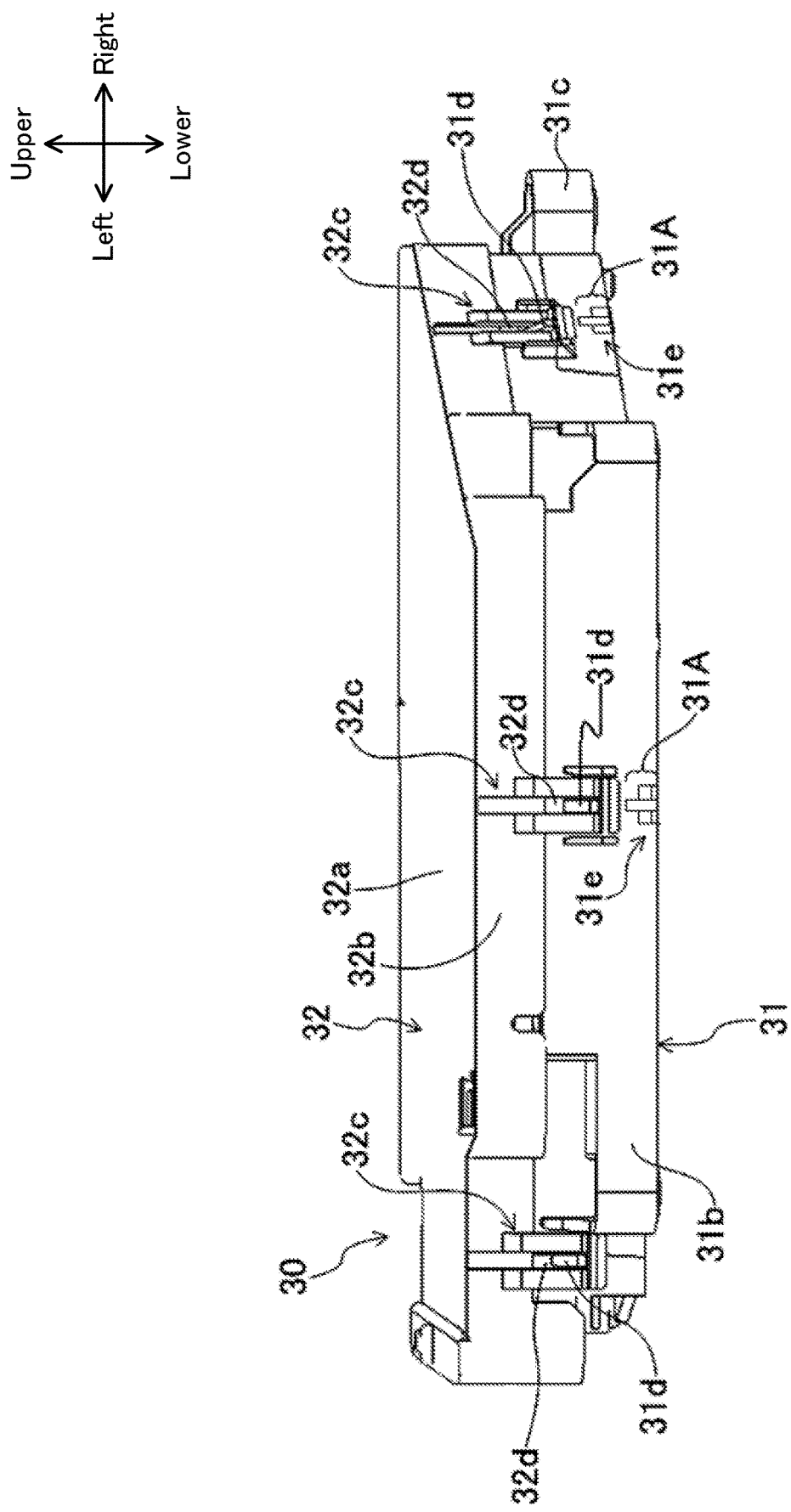
FIG. 5 is an external appearance perspective view of an assembled optical scanning device.

As illustrated in FIG. 5, the lid member 32 has a top plate 32a, a sidewall part 32b hung down from the top plate 32a and a peripheral edge part of the top plate 32a, and a fixing leg part 32c extending downward from the outside surface of the sidewall part 32b. The fixing leg part 32c is formed with a slit-like fixing hole 32d extending in the up and down direction. When the lid member 32 is mounted at and fixed to the casing 31, the fixing hole 32d of the fixing leg part 32c is allowed to be engaged with the engaging protruding parts 31d formed at the sidewall part 31b of the casing 31.

Figure 6:
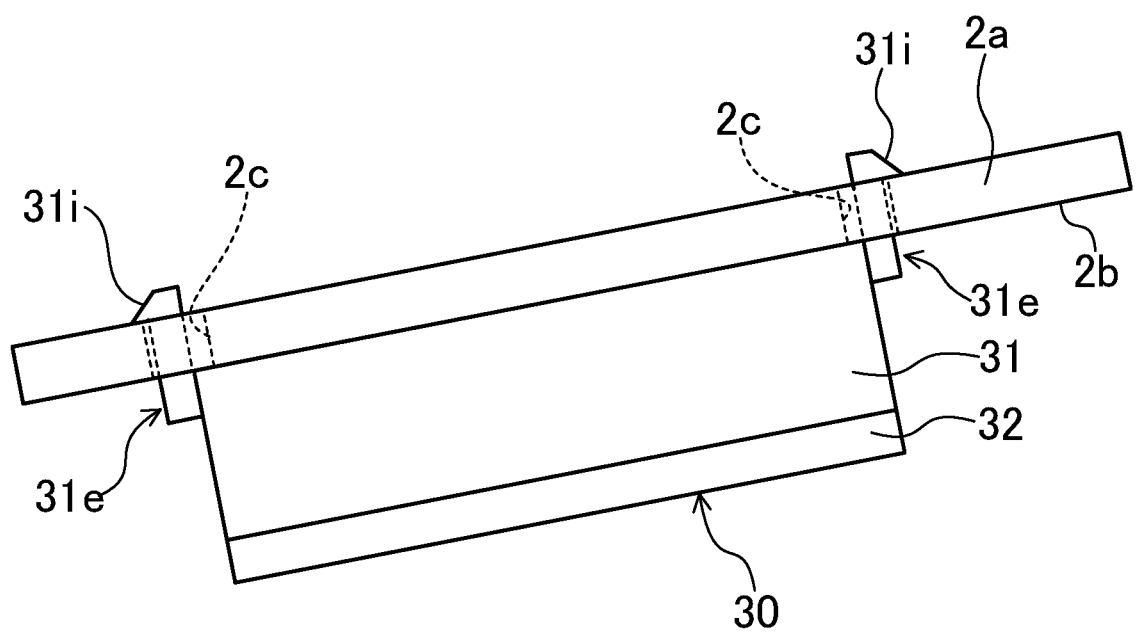
FIG. 6 is a schematic view illustrating a fixing structure of an optical scanning device with respect to a fixing member.

The assembled optical scanning device 30 is assembled to the fixing member 2a in the printer body 2. FIG. 6 is a schematic view illustrating an assembling structure of the optical scanning device 30 with respect to the fixing member 2a. At positions of the fixing member 2a, which correspond to the connection leg parts 31e of the casing 31, through holes (engaging parts for casing fixture) 2c are formed. When the optical scanning device 30 is assembled to the fixing member 2a, the connection leg parts 31e of the casing 31 are respectively allowed to pass through the through holes 2c, so that the claw parts 31i formed at the distal end parts of the connection leg parts 31e are allowed to be engaged with the rear surface of the fixing member 2a. In this way, the casing 31 is fixed to the fixing member 2a. In the present embodiment, the casing 31 is fixed to the fixing member 2a by the bolts passing through the fixing seat parts 31c, in addition to the claw parts 31i of the connection leg parts 31e. In this way, the casing 31 is firmly fixed to the fixing member 2a.

As described above, in the aforementioned embodiment 1, the casing 31 includes the connection leg parts 31e extending from predetermined positions of the outside surface of the sidewall part 31b to the lower side of the lower surface of the casing 31, wherein each connection leg part 31e is provided with the engaged hole 31g that is engaged with the aforementioned engaging protruding part (an engaging part) 31d formed at the sidewall part 31b of the casing 31 when the casing 31 is stacked on an upper side of another casing 31.

In this way, the casings 31 can be packed and transported in a state in which they have been stacked and connected to one another (the state of FIG. 4). Thus, as compared with a case where the casings 31 are packed one by one and are transported, it is possible to reduce transportation cost by improving space efficiency at the time of transportation. Furthermore, the interior of each casing 31 is covered and closed by another casing 31 stacked on the upper side thereof, so that an optical element installation surface in the casing 31 can be prevented from being exposed to an exterior and being damaged.

Furthermore, the aforementioned engaging protruding part 31d is also used as an engaging protruding part for allowing the lid member 32 to be engaged with and fixed to the outside surface of the sidewall part 31b of the casing 31, so that the engaging protruding part 31d having two functions of a lid member fixing function and a casing connection function can be efficiently disposed in a limited area of the outside surface of the sidewall part 31b. Thus, it is possible to prevent the optical scanning device 30 from increasing in size due to an excessive increase in the height of the sidewall part 31b.

Furthermore, the connection leg part 31e is provided with the claw part (an engaged part for casing fixture) 31i which is engaged with the rear surface of the fixing member 2a of the printer body 2. In this way, the connection leg part 31*e* can also be used for fixing the casing 31 to the printer body 2.

Embodiment 2

Figure 7:
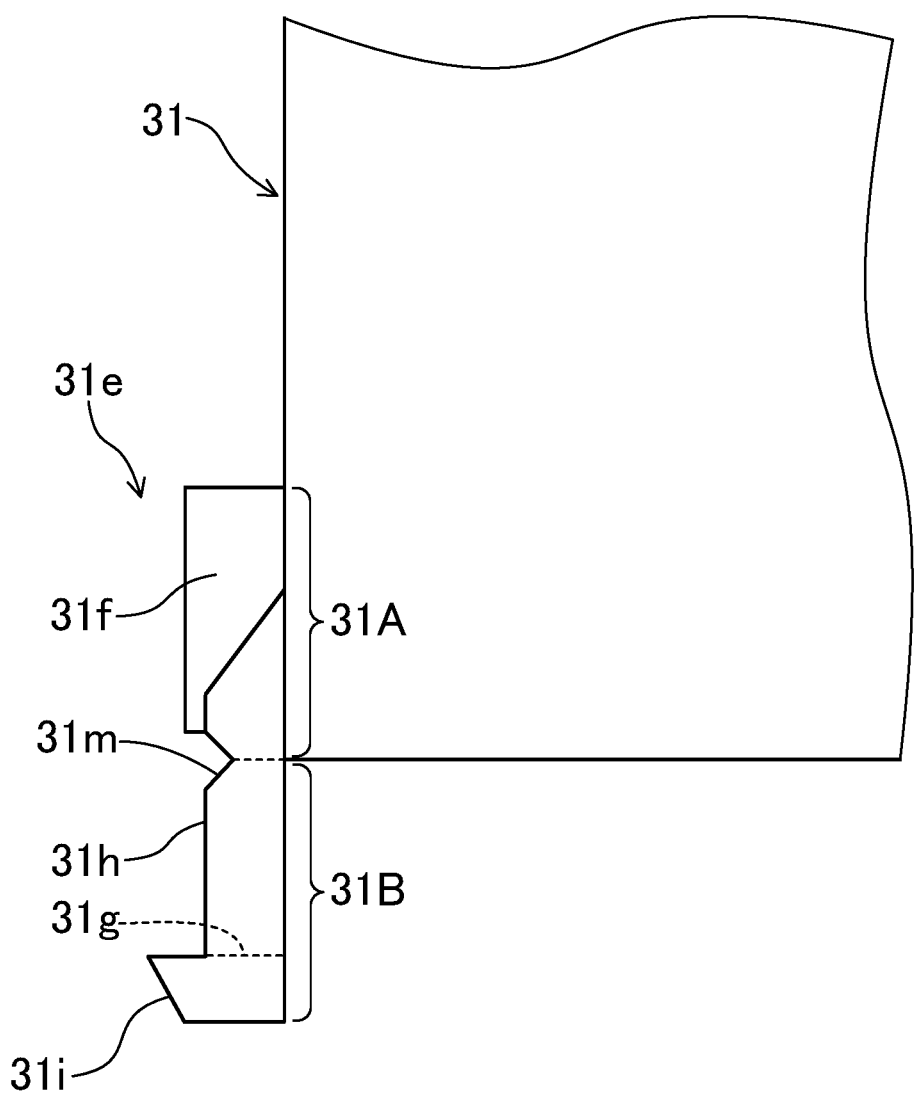
FIG. 7 is a side view illustrating a connection leg part formed in a casing of an optical scanning device according to an embodiment 2.
Figure 8:
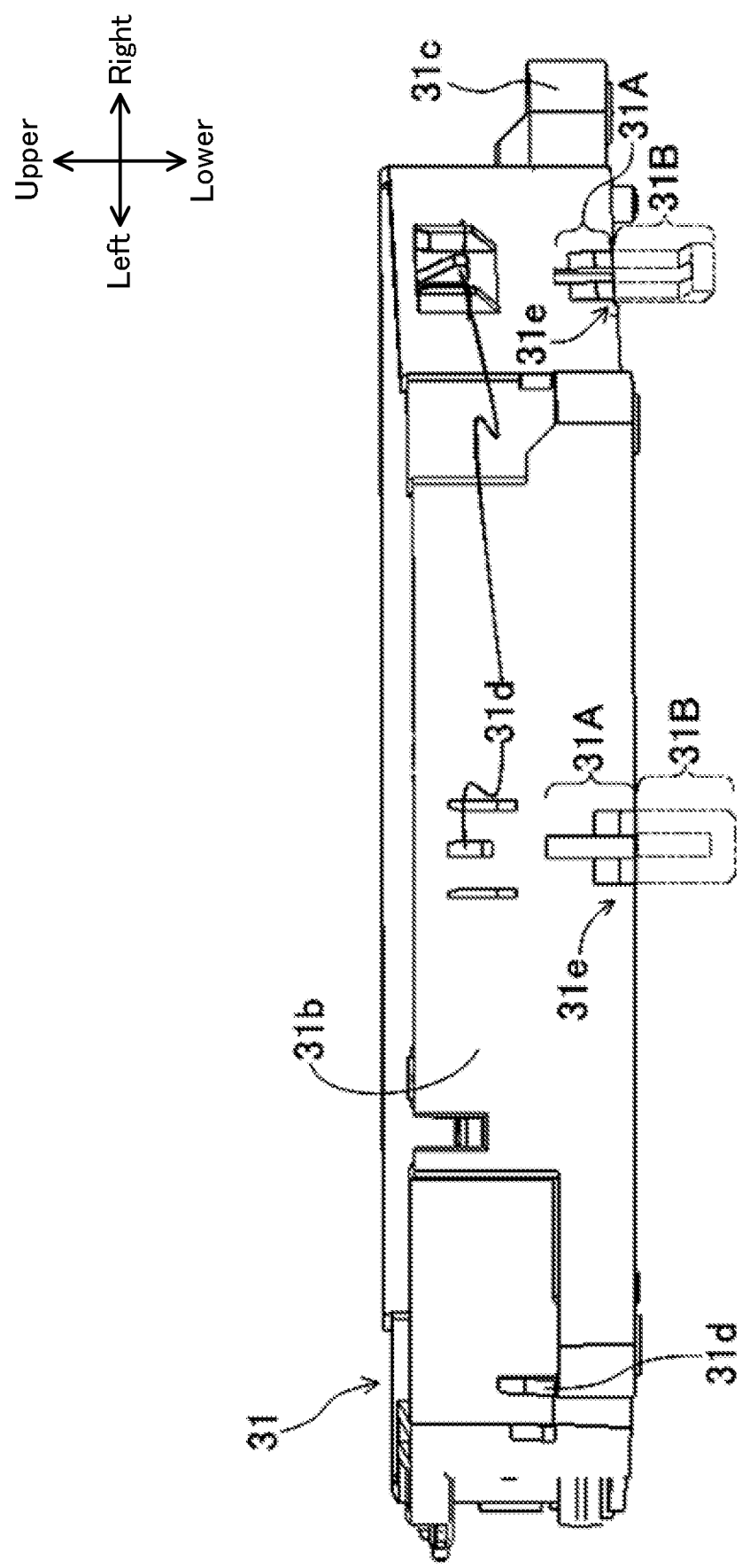
FIG. 8 is a side view illustrating a state in which a lower part of a connection leg part has been broken from an upper side in a casing.

FIG. 7 is a side view of the connection leg part 31*e* in the optical scanning device 30 of an embodiment 2. In the present embodiment, the configuration of the connection leg part 31*e* is different from that of the aforementioned embodiment 1. The same reference numerals are used to designate the same elements as those of the embodiment 1 and a detailed description thereof will be omitted.

That is, the present embodiment 2 is different from the aforementioned embodiment 1 in that in the connection leg part 31*e*, a groove part 31*m* is formed on the outside surface of the plate-like part 31*h* as a fragile part. The groove part 31*m* has a sectional V shape opened outward when viewed from the width direction of the plate-like part 31*h*. The groove part 31*m* is formed over the entire direction of the plate-like part 31*h*. The groove part 31*m* is formed at a position of the plate-like part 31*h*, which corresponds to the lower surface of the casing 31. In the present embodiment, a V shaped apex of the groove part 31*m* is positioned on an extension surface of the lower surface of the casing 31.

According to the present embodiment 2, since the groove part 31*m* is formed as a fragile part at a position of the connection leg part 31*e*, which corresponds to the lower surface of the casing 31, a worker presses the lower end part of the connection leg part 31*e* with his/her finger, so that a part 31B of the connection leg part 31*e*, which is lower than the lower surface of the casing 31, can be broken (separated) at the groove part 31*m*. Consequently, after the casing 31 is transported, the lower part 31B of the connection leg part 31*e* is broken for removal, so that the connection leg part 31*e* can be prevented from becoming an obstacle in assembling. In the present embodiment, since the lower part 31B of the connection leg part 31*e* is removed, it is sufficient if the casing 31 is fixed only by the bolts passing through passing through the fixing seat parts 31*c* of the casing 31 without employing the fixing structure illustrated in FIG. 6.

Other Embodiments

In the aforementioned embodiments, an engaging part of the sidewall part 31*b* of the casing 31 is configured with the engaging protruding part 31*d* and an engaged part for connection provided to the connection leg part 31*e* is configured with the engaged hole 31*g*; the present invention is not limited thereto. That is, as illustrated in FIG. 9, the engaging part of the sidewall part 31*b* of the casing 31 may be configured with an engaging hole 31*n* and the engaged part for connection provided to the connection leg part 31*e* may be configured with a claw part 31*r*. In such a case, the claw part 31*r* may be allowed to serve as the claw part 31*i* in the embodiment 1 so as to be used for fixing the casing 31 to the fixing member 2*a*. That is, the claw part 31*r* may also be used as an engaged part for casing fixture.

INDUSTRIAL APPLICABILITY

As described above, the present invention is available for a casing of an optical scanning device.

The invention claimed is:

1. A casing of an optical scanning device, which has a bottomed box shape and includes a bottom wall part and a sidewall part upright from a peripheral edge part of the bottom wall part, the sidewall part being formed on an outside surface thereof with an engaging part for engaging and fixing a lid member, wherein
    the casing is stackable in a plurality of stages in a state in which the lid member has been removed, and includes a connection leg part extending from a predetermined position of the outside surface of the sidewall part to a lower side of a lower surface of the casing, and
    the connection leg part is provided with an engaged part for connection which is engaged with an engaging part formed at a sidewall part of another casing when the casing is stacked on an upper side of the other casing.

2. The casing of the optical scanning device of claim 1, wherein at a part of the connection leg part, which corresponds to a lower surface of the casing, a fragile part is provided such that a part positioned at a lower side of the lower surface is breakable from a part positioned at an upper side of the lower surface.

3. The casing of the optical scanning device of claim 1, wherein the connection leg part is provided with an engaged part for casing fixture which is engaged with an engaging part for casing fixture formed at an image forming apparatus body.

4. The casing of the optical scanning device of claim 3, wherein the engaged part for casing fixture is also used as the engaged part for connection.

* * * * *